(12) United States Patent
Greeley

(10) Patent No.: US 7,166,877 B2
(45) Date of Patent: Jan. 23, 2007

(54) HIGH FREQUENCY VIA

(75) Inventor: John S Greeley, Ambler, PA (US)

(73) Assignee: Bae Systems Information and Electronic Systems Integration Inc., Nashua, NH (US)

( * ) Notice: Subject to any disclaimer, the term of this patent is extended or adjusted under 35 U.S.C. 154(b) by 132 days.

(21) Appl. No.: 10/903,566

(22) Filed: Jul. 30, 2004

(65) Prior Publication Data
US 2006/0022312 A1 Feb. 2, 2006

(51) Int. Cl.
H01L 29/80 (2006.01)

(52) U.S. Cl. ............... 257/259; 257/275; 257/728

(58) Field of Classification Search ........... 257/728, 257/275, 664, 259, 662; 505/866
See application file for complete search history.

(56) References Cited

U.S. PATENT DOCUMENTS

| | | | |
|---|---|---|---|
| 4,807,022 A | 2/1989 | Kazior et al. | |
| 4,925,723 A | 5/1990 | Bujatti et al. | |
| 4,927,784 A | 5/1990 | Kazior et al. | |
| 5,023,994 A | 6/1991 | Bujatti et al. | |
| 5,089,880 A * | 2/1992 | Meyer et al. | 257/692 |
| 5,208,726 A | 5/1993 | Apel | |
| 5,870,289 A * | 2/1999 | Tokuda et al. | 361/779 |
| 5,949,140 A | 9/1999 | Nishi et al. | |
| 6,081,241 A | 6/2000 | Josefsson et al. | |
| 6,181,278 B1 | 1/2001 | Kakimoto et al. | |
| 6,356,173 B1 | 3/2002 | Nagata et al. | |
| 6,359,536 B1 | 3/2002 | Sakamoto et al. | |
| 6,538,538 B2 | 3/2003 | Hreish et al. | |
| 6,661,316 B2 | 12/2003 | Hreish et al. | |
| 6,713,853 B1 * | 3/2004 | Fazelpour et al. | 257/680 |
| 2003/0160322 A1 | 8/2003 | Hsieh et al. | |
| 2004/0100754 A1 | 5/2004 | Jozwiak et al. | |

OTHER PUBLICATIONS

"Introduction to Common Printed Circuit Transmission Lines", www.maxim-ic.com, Jun. 2, 2003, pp. 1-5, Application Note 2093.
"Layout Guidelines For MMIC Components", www.hitite.com, Feb. 2001, pp. 1-3, vol. 01.0300.

* cited by examiner

Primary Examiner—Douglas W. Owens
(74) Attorney, Agent, or Firm—Maine & Asmus

(57) ABSTRACT

Techniques that enable the transitioning of high frequency signals on a printed wiring board processed in accordance with industry standards (such as the IPC specifications) are disclosed. One embodiment provides a high frequency via structure for a printed wiring board, where the via structure includes a via pad configured in accordance with IPC standards. A printed microwave transmission line having an inductive section is connected to the via pad, wherein the inductive section has dimensions to compensate for transition discontinuity.

15 Claims, 2 Drawing Sheets

HIGH FREQUENCY VIA

STATEMENT OF GOVERNMENT INTEREST

Portions of the present invention may have been made in conjunction with Government funding, and there may be certain rights to the U.S. Government.

RELATED APPLICATIONS

This application is related to U.S. application Ser. No. 10/903,534, filed Jul. 30, 2004, titled "High Frequency Via with Stripped Semi-Rigid Cable", and to U.S. application Ser. No. 10/903,535, filed Jul. 30, 2004, titled "Transmission Line with Stripped Semi-Rigid Cable". Each of these applications is herein incorporated in its entirety by reference.

FIELD OF THE INVENTION

The invention relates to high frequency printed wiring boards, and more particularly, to a high frequency via.

BACKGROUND OF THE INVENTION

Microwave signals are transmitted from point-to-point by waveguides or antennas. The main difference between the two is that an antenna radiates the electromagnetic field into open space, while a waveguide confines the electromagnetic field to an area along the signal path. There are a number of conventional waveguide sub-categories.

A transmission line is one such sub-category. It uses some physical configuration of metal and/or dielectrics to direct a signal along the desired path. Typical transmission lines use two conductors—a signal and ground. There are also single conductor transmission lines, such as rectangular waveguides. The simplest type of transmission line configuration is coaxial line. Stripline is essentially a flattened version of the coaxial line configuration. Microstrip line simplifies the stripline configuration, by removing the upper ground planes.

Microstrip line is generally the most commonly used means for planar transmission line applications, because it is highly manufacturable and eases circuit connections and signal probing. Its disadvantage over stripline is that some of the energy transmitted may couple to adjacent traces or into space. Unlike microwave antennas, microwave waveguides are not intended to radiate energy in this way, which causes signal loss and interference. A coplanar waveguide with ground (CPWG) is essentially a low radiation version of microstrip.

In any case, as a microwave signal travels down the signal path of a waveguide, it is subjected to various characteristics associated with that path, such as path discontinuity. Such characteristics generally impact on the waveguides performance, and must be taken into account. For example, consider the case where a microwave signal must be routed through a printed wiring board. Passing from one layer of the printed-circuit board to another can be achieved with metallic pads on each layer, and a hole that is plated with metal to connect these pads. Such structures are commonly called vias. The via pad is typically surrounded by a ground plane, with a ground gap in between.

The problem here is that standard processing of printed wiring boards does not accommodate the particularities associated with microwave applications in high density RF environments. For instance, IPC, formerly known as the Institute for Printed Circuits, is an organization that provides standards in the electronic interconnection industry. Generally, via structures must be made according to design rules that accommodate IPC standard processing techniques. Often times, however, the minimum pad size for a given via diameter is significantly larger than the transmission line conductor that attaches to it. Such discontinuity ultimately limits device performance at high microwave frequencies (e.g., greater than 2 GHz).

What is needed, therefore, are techniques for transitioning high frequency signals on a printed wiring board processed in accordance with industry standards, such as the IPC specifications.

SUMMARY OF THE INVENTION

One embodiment of the present invention provides a printed wiring board that includes high frequency via structures that are compliant with IPC-based design rules (or other such standards). The board includes one or more via pads configured in accordance with IPC standards. The board also includes one or more printed microwave transmission lines. Each transmission line includes an inductive section connected to a corresponding one of the via pads, wherein each inductive section has dimensions to compensate for transition discontinuity. In one particular such embodiment, each via pad is circular and has a diameter, and each inductive section has a length that is about twice the diameter of its corresponding via pad or less.

The board may further include a ground gap about at least one of the via pads that is configured to reduce pad capacitance. In one particular case, the ground gap about the at least one via pad is greater than a ground gap about the corresponding transmission line. The ground gap can be, for example, about 8 mils or greater. In one particular example, the printed wiring board is multilayer, and at least one of the high frequency via structures couples one layer to another layer. Alternatively, the printed wiring board is a single layer board having top and bottom surfaces, and the high frequency via structures couple the top surface of the board to the bottom surface of the board. The transmission lines can be, for example, at least one of microstrip lines, stripline, and CPWG transmission lines (or other high frequency transmission lines that cause a discontinuity when coupled to their corresponding via pad). The board may further include a metallized via hole connecting two via pads (each pad on a different layer of the board), and two or more signal return vias proximate the metallized via hole and the inductive section of the transmission line. The spacing between the signal return vias and the metallized via hole is selected to provide additional compensation for transition discontinuity.

Another embodiment of the present invention provides a method for manufacturing a printed wiring board that includes high frequency via structures that are compliant with IPC-based design rules. The method includes fabricating a printed wiring board that includes one or more via pads configured in accordance with IPC standards (or other such standards). The method further includes fabricating the printed wiring board to further include one or more printed microwave transmission lines, each including an inductive section connected to a corresponding one of the via pads, wherein each inductive section has dimensions to compensate for transition discontinuity. In one particular such embodiment, each via pad is circular and has a diameter, and each inductive section has a length that is about twice the diameter of its corresponding via pad or less.

The method may further include fabricating the printed wiring board to include a ground gap about at least one of the via pads that is configured to reduce pad capacitance. In one such embodiment, the ground gap about the at least one via pad is greater than a ground gap about the corresponding transmission line. In one particular example, the printed wiring board is multilayer, and at least one of the high frequency via structures couples one layer to another layer (internal and/or external layers can be coupled by the high frequency via structures). Alternatively, the printed wiring board is a single layer board having top and bottom surfaces, and the high frequency via structures couple the top surface of the board to the bottom surface of the board. The method may further include fabricating the printed wiring board to further include a metallized via hole connecting two via pads (where each pad is on a different layer of the board), and fabricating the printed wiring board to further include two or more signal return vias proximate the metallized via hole and the inductive section of the transmission line. The spacing between the signal return vias and the metallized via hole is selected to provide additional compensation for transition discontinuity.

Another embodiment of the present invention provides a high frequency via structure for a printed wiring board. The via includes a via pad configured in accordance with standards that neglect issues associated with high frequency applications (e.g., microwave), including transition discontinuity. For example, the via pad might be configured in accordance with IPC standards. A printed microwave transmission line having an inductive section is connected to the via pad, wherein the inductive section has dimensions to compensate for transition discontinuity. In one particular such embodiment, the via pad is circular and has a diameter, and the inductive section has a length that is about twice the diameter of its corresponding via pad or less.

The via may further include a ground gap about the via pad that is configured to reduce pad capacitance. In one such embodiment, the ground gap about the via pad is greater than a ground gap about the transmission line. Note that the ground gap about the transmission line is set based on the desired line impedance (e.g., 50 ohms). The via may further include a metallized via hole connecting the via pad to another via pad, and two or more signal return vias proximate the metallized via hole and the inductive section of the transmission line. The spacing between the signal return vias and the metallized via hole is selected to provide additional compensation for transition discontinuity.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

Figure 1A:
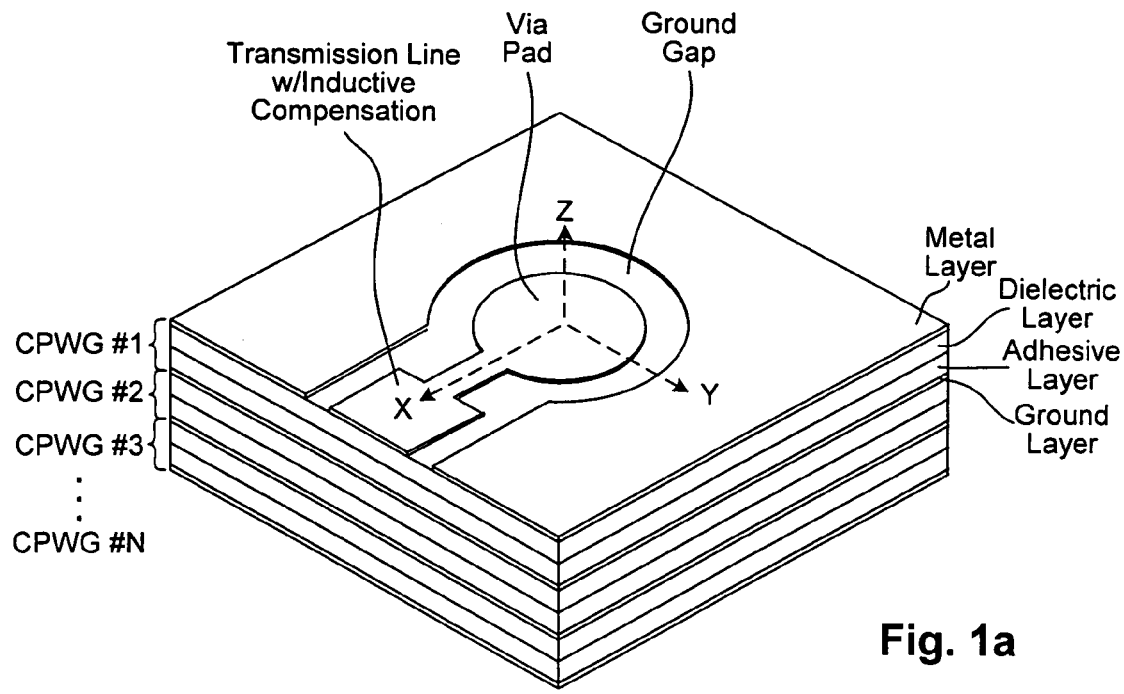
FIGS. 1a and 1b illustrate a high frequency via configured in accordance with one embodiment of the present invention.
Figure 1B:
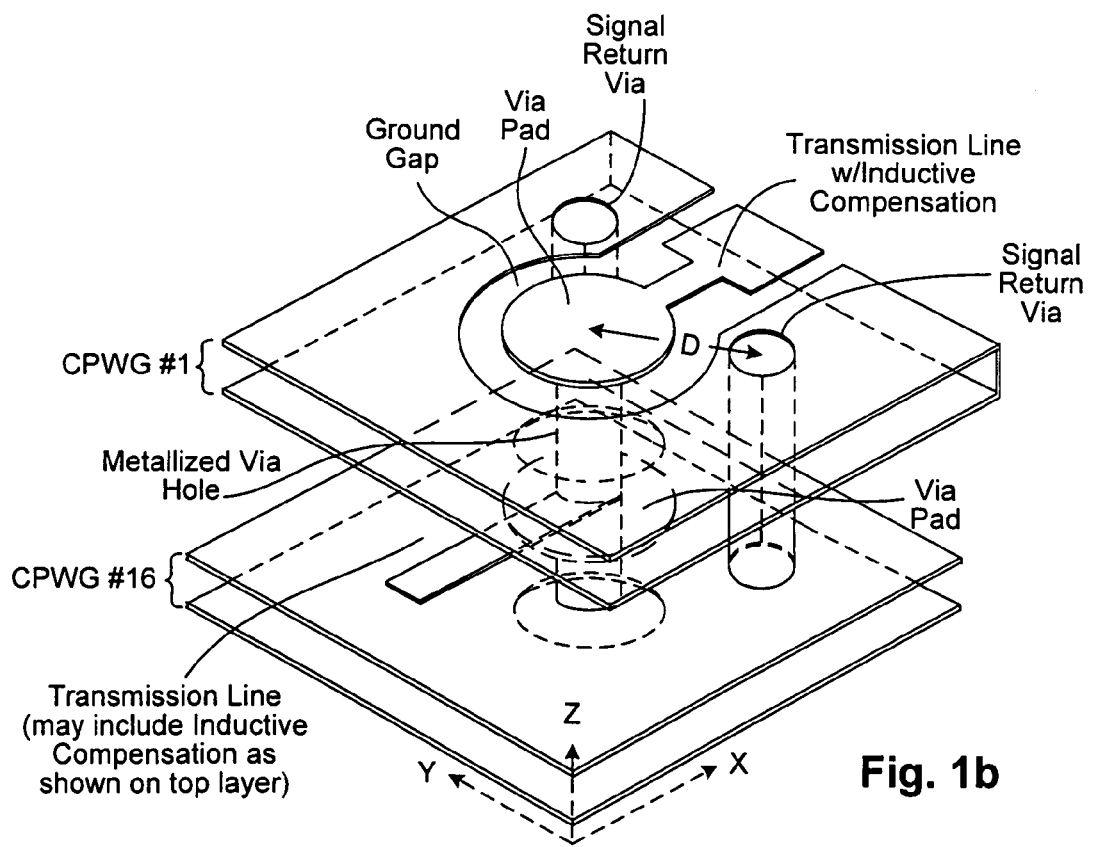

Note that the various features shown in FIGS. 1a and 1b are not drawn to any particular scale. Rather, the figures are drawn to emphasize features and structure for purposes of explanation. The actual geometries and scale of the pertinent features and structure will be apparent in light of this disclosure

DETAILED DESCRIPTION OF THE INVENTION

Embodiments of the present invention enable the transitioning of high frequency signals on a printed wiring board (PWB) processed in accordance with industry standards, such as the IPC specifications.

It is often desirable to integrate high frequency (e.g., microwave) components onto a printed wiring board. However, and as previously explained, via structures which carry a signal from one layer of the board to another must be made according to design rules that accommodate standards-based processing. These standard board design rules, in conjunction with typical microwave design rules, lead to discontinuity that ultimately limits performance of a high frequency circuit (e.g., unacceptable VSWR) on a standards-compliant printed wiring board.

For instance, consider the case where a via structure includes metal via pads coupled by a metallized hole. Here, the minimum pad size for a given via diameter (e.g., as specified by the IPC) is typically much larger than the transmission line conductor that attaches to it, thereby causing a transition discontinuity.

PWB with High Frequency Coax Via

FIGS. 1a and 1b illustrate a high frequency via configured in accordance with one embodiment of the present invention. Here, a printed wiring board having a CPWG configuration is shown. Each CPWG includes a metal layer, a dielectric layer, an adhesive layer, and a ground layer.

Note that the number of CPWG layers, as well as the design and make-up of their sub-layers, will vary depending on the particular application. Numerous configurations are possible, as will be apparent in light of this disclosure. Further note that phantom layers (those layers that have been etched away during the fabrication process of the board) are not shown. Phantom layers in this particular embodiment include copper layers between the dielectric and adhesive layers. Other such layers and sacrificial materials used to facilitate fabrication processes can be used here as well, depending on the particular printed wiring board design.

As can be seen, a via structure couples the top CPWG with the bottom CPWG. The via structure includes two via pads coupled together by a metallized via hole, as is conventionally done. Electrical signals can travel between the top to the bottom CPWGs. The via pads and hole can be configured to comply with any processing standard for printed wiring boards, such as IPC specifications or any such standards that neglect microwave design considerations.

Also shown in FIG. 1b are two signal return vias to either side of the metallized signal via hole and proximate to the inductive compensation section of the transmission line. These ground or "signal return" vias provide a signal return for the transition between the via pad and the transmission line. The ground vias are plated through holes that couple the ground layer associated with the top side via pad to the ground layer associated with the intermediate via pad.

The number of ground vias used, as well as the width of the ground vias and their distance from the signal via hole will vary depending on the particular application and desired parameters (e.g., maximum operating frequency and signal return loss). Note that certain standards, such as the IPC specifications, constrain via holes to a maximum aspect ratio (i.e., ratio of height to width).

For example, assume the IPC guidelines are applicable, where the maximum aspect ratio is 5:1. Further assume a 50 ohm impedance PWB application, where the overall PWB thickness is about 100 mils. This PWB thickness effectively sets the minimum diameter of the vias that go through the entire PWB. Once this diameter is set, the distances between the signal via and the ground vias can be determined. Note that the spacing is not necessarily set for a 50 ohm transmission line in the vertical direction, but is actually set slightly higher to achieve some additional inductance between via pads. In such a case, the signal return ground vias and the signal via hole could each be, for instance, 100 mils in length by 20 mils in width. Other height-width configurations will be apparent in light of this disclosure.

In any such configurations, a greater degree of compensation can be achieved by spacing the signal return vias from the signal via. In one particular embodiment, the distance from the center of the signal via hole to the center of each ground via is about 50 mils. This distance is designated as "D" in FIG. 1b. Generally, the distance is set by the impedance necessary to achieve the remainder of the broadband compensation. The greater the distance, the greater the degree of compensation that is provided. Conventional microwave design rules will apply, given particulars like maximum operating frequency, desired impedance, and the type of semi-rigid cable used.

A transmission line on each respective CPWG top layer couples to the corresponding via pad. The ground gap is shown for CPWG #1. Various other conventional elements and features of the printed wiring board are not shown in FIGS. 1a and 1b, but may be included as necessary. For instance, additional signal vias and their corresponding signal return vias may be included to couple other layers, whether internal, external, or a combination.

The transmission line of CPWG #1 is configured with inductive compensation, which effectively compensates for the discontinuity between the transmission line and the relatively large via pad. The inductive compensation for the discontinuity is achieved by printing or otherwise placing an inductive section of transmission line in series with the via structure.

As can be seen in FIGS. 1a and 1b, the inductive section is the reduced width section of transmission line. The inductive section operates in conjunction with the capacitance of the via structure to absorb the pad capacitance into a broadband low pass filter. The discontinuity between the transmission line and the via pad is essentially absorbed into or otherwise mitigated by this low pass filter.

The maximum length (along the X-axis) of the inductive section is about twice the diameter of the pad to be compensated. The width (along the Y-axis) of the inductive section will vary depending on the compensation needed. Generally stated, the narrower the width of the inductive section, the greater the inductance it will provide. Thus, larger via pads will require narrower inductive sections.

The width of the ground gap is the distance between the ground plane and the via pad, or between the ground plane and the transmission line. It typically remains uniform about the via pad, as well as along the transmission line. However, this gap width about the pad can be increased to minimize the capacitance of the via pad area. This will further help increase the bandwidth of the via. Opening the ground gap about the pad also serves to move some of the transmission line current from the surrounding ground plane, and forces it to follow the nearest ground via downward along with the intended signal as desired. Recall that the ground gap about the transmission impacts the impedance of the line, and is set accordingly. Thus, the gap about the pad may be one size (e.g., so as to minimize pad capacitance), and the gap about the transmission line can be another size (e.g., so as to maintain 50 ohm impedance).

As will be apparent in light of this disclosure, the inductive section can have numerous configurations, depending on the particular application and the via pad size. In one specific embodiment, the via pad is about 42 mils (per IPC standards) and the maximum operating frequency is about 5 GHz. The ground gap, which is one half of the difference between the via pad diameter and the diameter of the hole in which the via pad sits, is about 11 to 12 mils. Said differently, the hole in which the via pad sits is about 65 mils ([65 mils−42 mils]/2=11.5 mil ground gap). The length (along the X-axis) of the inductive section of the transmission line is about 30 mils. The width of the inductive section (along the Y-axis) is about 22 mils. Given a uniform ground gap of about 11.5 mils, the width of the trough in which the transmission line sits in is about 45 mils ([45 mils−22 mils]/2=11.5 mil ground gap). Alternatively, the ground gap can be wider about the pad than it is about the transmission line (e.g., 8 mils about transmission line to maintain 50 ohms impedance and 12 mils about the pad to reduce pad capacitance). Metallized layers of each CPWG are provided with copper. Each dielectric layer is Rogers 4003, and each adhesive layer is Rogers 4350. In this particular embodiment, there are 16 CPWG layers.

Note that the wider part of the transmission line can be configured in a variety of ways. In this particular case, the wider part is a standard 50 ohm transmission line. A CPWG transmission line with an 8 to 12 mil gap was chosen in the illustrated embodiment because the gap was sufficiently large that it could be etched with uniformity, but small enough that it has reduced radiation compared to pure microstrip. Further note that the wider the transmission line, the wider the gap has to be so as to maintain 50 ohms for impedance matching.

Other metal, dielectric, and adhesive materials and feature dimensions will be apparent in light of this disclosure, and the present invention is not intended to be limited to any one such configuration. For example, metals other than copper can be used, such as gold, silver or aluminum. Likewise, other dielectric and bonding materials can be used. Also, the dimensions of the inductive section will depend on the maximum operating frequency and the via pad size. As previously stated, larger via pads will require narrower inductive sections. Further note that the discontinuity compensation scheme described herein equally applies to high frequency via structures located on internal or intermediate layers of the board.

In any such cases, a high frequency transmission line can be printed with built-in inductive compensation to mitigate the discontinuity between that transmission line and a standardized via pad (e.g., per IPC specifications). Thus, a printed wiring board can be fabricated that is adapted to receive both high frequency surface mount components and traditional surface mount components. The performance of layer-to-layer microwave transitions at high frequencies (e.g., 2 to 5 GHz) for such boards is enhanced. In particular, the return loss of a transition according to the specific embodiment discussed described earlier improved from about 12.5 dB to 18 dB at 5 GHz.

In addition, the fabrication process is more efficient and less costly than conventional techniques, where printed wiring boards intended for such mixed component applications are adapted purely to microwave design rules. Because of the special considerations associated with such high frequency applications, these specially adapted conventional boards are expensive and usually incompatible with more traditional surface mount circuits.

Methodology

Figure 2:
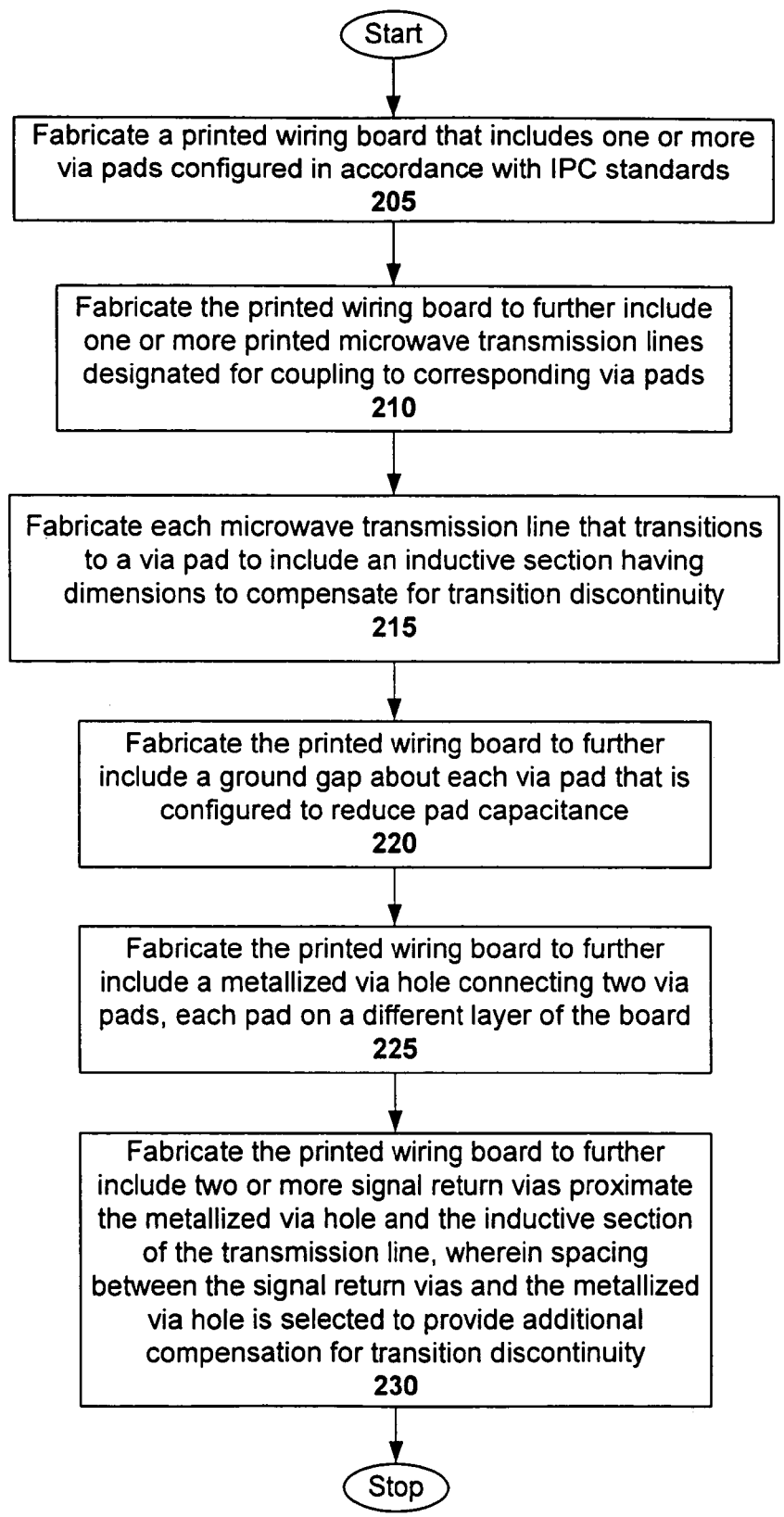
FIG. 2 illustrates a method for manufacturing a printed wiring board that includes high frequency via structures that are compliant with IPC-based design rules in accordance with another embodiment of the present invention.

FIG. 2 illustrates a method for manufacturing a printed wiring board that includes high frequency via structures that are compliant with IPC-based design rules in accordance with another embodiment of the present invention. This method can be used, for example, to fabricate the printed wiring board shown in FIGS. 1a and 1b. Other boards can also be fabricated according to the method, as will be apparent in light of this disclosure.

The method includes fabricating 205 a printed wiring board that includes one or more via pads configured in accordance with IPC standards (or other such standards that fail to accommodate the design needs of high frequency circuits). The board may include any other conventional or custom features as well. The board can be fabricated using conventional photolithography and mechanical drilling, or other known fabrication techniques. The board may be multilayer, where the via couples one layer to another layer (internal and/or external layers). Alternatively, the board may be a single layer board, where the via couples the top surface of the board to the bottom surface of the board.

The method continues with fabricating 210 the printed wiring board to further include one or more printed microwave transmission lines designated for coupling to corresponding via pads. The transmission lines can be, for example, microstrip line CPWG transmission lines. Alternatively, the transmission lines can be any type of printed high frequency transmission line, where each of the one or more lines would generally cause a discontinuity when transitioning to its corresponding via pad.

The method continues with fabricating 215 each microwave transmission line that transitions to a via pad to include an inductive section having dimensions to compensate for transition discontinuity. The maximum length of the inductive section is about twice the diameter of the corresponding via pad. As previously explained, the width of the inductive section can be selected depending on the compensation needed (which depends on the size of the via pad). Generally stated, the narrower the inductive section, the greater the inductance it will provide. In addition, the larger the via pad, the more capacitance it will provide. Greater capacitance requires greater inductance to properly absorb the transition discontinuity. However, the pad capacitance may determine the upper frequency limit of the via transition.

The method may further include fabricating 220 the printed wiring board to also include a ground gap about each via pad. In one particular embodiment, the ground gap is about 8 mils or greater. The gap can be configured to further minimize or otherwise reduce the capacitance of the pad area, which will help increase the bandwidth of the via. For example, the ground gap about each of the via pads can be extended to about 12 mils, while the ground gap about the transmission lines remains at about 8 mils. Opening the ground gap about the via pads also serves to move some of the transmission line current from the surrounding ground plane, and forces it to follow the nearest ground via downward along with the intended signal as desired.

The method may further include fabricating 225 the printed wiring board to also include a metallized via hole connecting two via pads, each pad on a different layer of the board. Such metallized via holes are sometimes referred to as signal vias. The may further include fabricating 230 the printed wiring board to also include two or more signal return vias proximate the metallized via hole and the inductive section of the transmission line. The spacing between the signal return vias and the metallized via hole can be selected so as to provide additional compensation for transition discontinuity.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A printed wiring board that includes high frequency via structures that are compliant with IPC-based design rules, the board comprising:

one or more via pads wherein each of said via pads have a ground gap, said one or more via pads configured in accordance with IPC standards;

one or more printed microwave transmission lines, wherein each of said printed microwave transmission lines have a ground gap, said printed microwave transmission lines each including an inductive section connected to a corresponding one of the via pads;

a metallized via hole connecting two via pads, each pad on a different layer of the board; and two or more signal return vias proximate the metallized via hole and the inductive section of the transmission line;

wherein spacing between the signal return vias and the metallized via hole is selected to provide additional compensation for transition discontinuity.

2. The board of claim 1 wherein the ground gap about each of the one or more via pads is greater than said ground gap about the corresponding transmission lines.

3. The board of claim 1 wherein the printed wiring board is multilayer, and at least one of the high frequency via structures couples one layer to another layer.

4. The board of claim 1 wherein the printed wiring board is a single layer board having top and bottom surfaces, and the high frequency via structures couple the top surface of the board to the bottom surface of the board.

5. The board of claim 1 wherein the transmission lines are at least one of microstrip lines, stripline, and CPWG transmission lines.

6. The board of claim 1 wherein each via pad is circular and has a diameter, and each inductive section has a maximum length that is about twice the diameter of its corresponding via pad.

7. The board of claim 1 wherein the inductive section has a width that is inversely proportional to a size of the via pad.

8. A method for manufacturing a printed wiring board that includes high frequency via structures that are compliant with IPC-based design rules, the method comprising:

fabricating a printed wiring board that includes one or more via pads configured in accordance with IPC standards each of said one or more via pads having a ground gap;

fabricating the printed wiring board to further include one or more printed microwave transmission lines, each including an inductive section connected to a corresponding one of the via pads, wherein each of said one or more transmission lines has a ground gap;

fabricating the printed wiring board to further include a metallized via hole connecting two via pads, each pad on a different layer of the board; and fabricating the printed wiring board to further include two or more signal return vias proximate the metallized via hole and the inductive section of the transmission line;

wherein spacing between the signal return vias and the metallized via hole is selected to provide additional compensation for transition discontinuity.

9. The method of claim 8 wherein the ground gap about the one or more via pads is greater than the ground gap about the corresponding transmission lines.

10. The method of claim 8 wherein the printed wiring board is multilayer, and at least one of the high frequency via structures couples one layer to another layer.

11. The method of claim 8 wherein the printed wiring board is a single layer board having top and bottom surfaces, and at least one of the high frequency via structures couples the top surface of the board to the bottom surface of the board.

12. The method of claim 8 wherein each via pad is circular and has a diameter, and each inductive section has a maximum length that is about twice the diameter of its corresponding via pad.

13. A high frequency via structure for a printed wiring board, the via comprising:

a via pad configured in accordance with IPC standards said via pad having a ground gap;

a printed microwave transmission line having an inductive section connected to the via pad, and a ground gap about the transmission line and wherein said ground gap about said via pad is greater than said ground gap about said microwave transmission lines;

a metallized via hole connecting the via pad to another via pad; and two or more signal return vias proximate the metallized via hole and the inductive section of the transmission line;

wherein spacing between the signal return vias and the metallized via hole is selected to provide additional inductance to compensate for transition discontinuity.

14. The via of claim 13 wherein the via pad is circular and has a diameter, and the inductive section has a maximum length that is about twice the diameter of its corresponding via pad.

15. The via of claim 13 wherein a capacitance increases with a size of said via pad and wherein an inductance from said inductive section decreases as a width of said inductive section increases.

* * * * *